United States Patent [19]

Mason et al.

[11] Patent Number: 5,124,572
[45] Date of Patent: Jun. 23, 1992

[54] VLSI CLOCKING SYSTEM USING BOTH OVERLAPPING AND NON-OVERLAPPING CLOCKS

[75] Inventors: Russell W. Mason; Joel D. Lamb, both of Ft. Collins, Colo.; Leon J. Sigal, Monsey, N.Y.

[73] Assignee: Hewlett-Packard Co., Palo Alto, Calif.

[21] Appl. No.: 619,280

[22] Filed: Nov. 27, 1990

[51] Int. Cl.⁵ .................. H03K 5/13; H03K 5/00; H03K 3/01; G11C 19/00
[52] U.S. Cl. ........................... 307/269; 307/262; 307/480; 307/272.1; 328/62; 328/63; 328/72; 377/78
[58] Field of Search .............. 307/269, 262, 480, 590, 307/601, 272.1; 328/109, 118, 55, 133, 72, 63, 62; 377/104, 105, 78, 79

[56] References Cited

U.S. PATENT DOCUMENTS

| | | | |
|---|---|---|---|
| 4,595,845 | 6/1986 | Briggs | 307/360 |
| 4,827,157 | 5/1989 | Machida et al. | 307/269 |
| 4,922,137 | 5/1990 | Small et al. | 307/269 |
| 4,970,405 | 11/1990 | Hagiwara | 307/269 |
| 4,999,526 | 3/1991 | Dudley | 307/269 |

Primary Examiner—Stanley D. Miller
Assistant Examiner—Trong Phan

[57] ABSTRACT

A clocking methodology for VLSI chips which uses global overlapping clocks plus locally or remotely generated non-overlapping clocks. Two overlapping clocks and two non-overlapping clocks are thus available in each block of a chip for use as timing edges. The global overlapping clocks are used where possible to provide timing advantages, while the non-overlapping clocks are used to eliminate race conditions as data propagates down a pipeline of transparent registers. Generally, one non-overlapping clock has an edge which must fall before a clock edge of the other non-overlapping clock rises and an edge which must rise after a clock edge of the other non-overlapping clock falls. These signals may be applied to adjacent stages to prevent race conditions; however, the "dead" time between the falling of one clock edge and the rising of the other clock edge has performance costs. Overlapping clocks are used whenever such race conditions can be avoided, as at the ends of the register pipeline, with the resultant performance improvement. The non-overlapping clock signals are preferably derived from the overlapping clock signals inside each block rather than globally so that it is easier to control the skew between phases of the non-overlapping clock signals. Such use of local non-overlapping clock generators in each block also reduces the amount of capacitive loading on the global overlapping clock network, thereby allowing faster edges and smaller skews on the global overlapping clock which further improves the performance of critical timing paths which use the global overlapping clock.

12 Claims, 4 Drawing Sheets

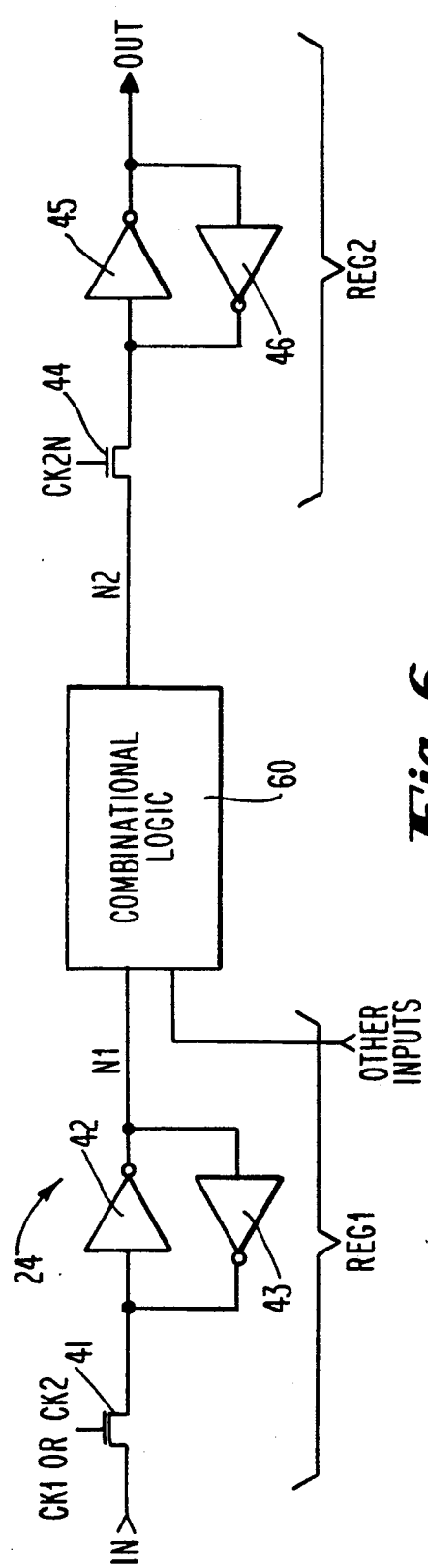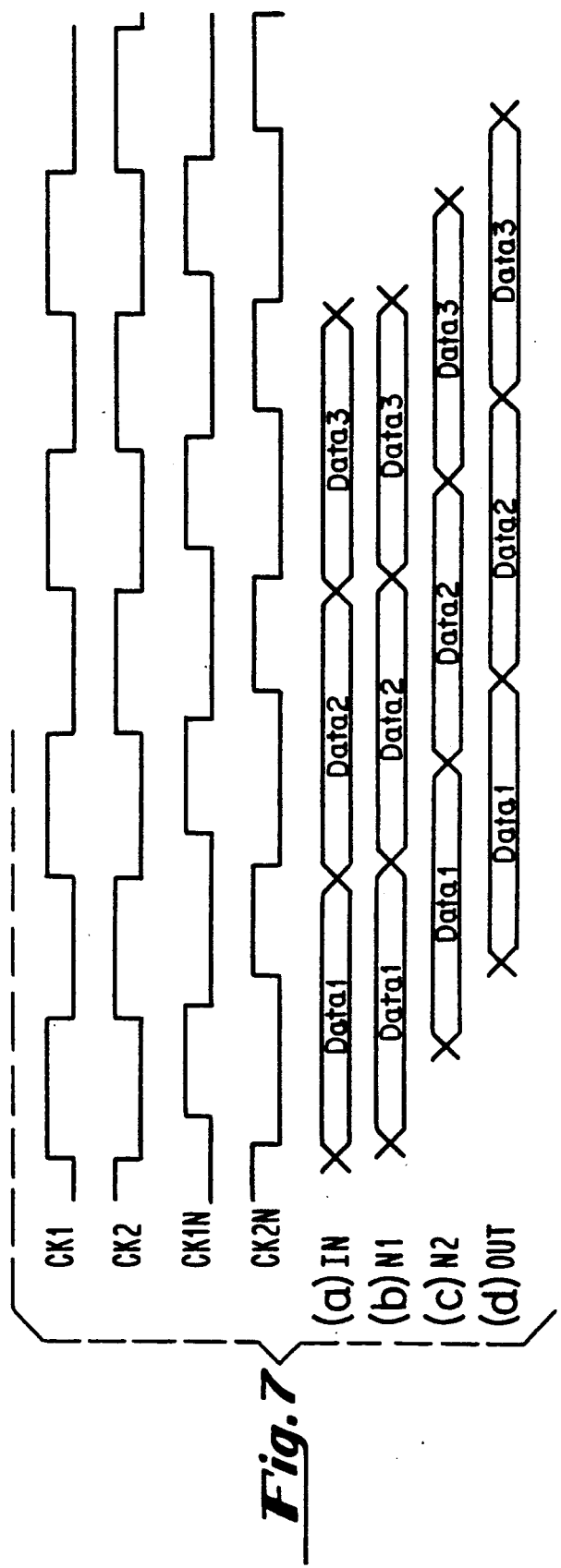
Fig. 6
Fig. 7

VLSI CLOCKING SYSTEM USING BOTH OVERLAPPING AND NON-OVERLAPPING CLOCKS

BACKGROUND OF THE INVENTION

1. Field of the Invention

The present invention relates to a VLSI clocking methodology which uses both global overlapping and global or locally generated non-overlapping clocks, and more particularly, to a clocking system which selectively uses non-overlapping clocks to eliminate race conditions and selectively uses overlapping clocks for performance enhancement.

2. Description of the Prior Art

The performance of very large scale integration (VLSI) systems has been improved by designing hardware which can handle greater clock frequencies. However, as the clock frequencies to such circuits are increased, increased efforts must be made to prevent performance degradation as a result of clock skew and the like. Unfortunately, since pipelined data processing systems generally use global clocks, which are generally a pair of differential symmetric clocks generated by a centralized clocking circuit, the skew and the rise/fall times of the clocking signals received by the respective pipelined circuits are poorly controlled. Thus, if the skew is large, slow clock signal fall times result which, for fast circuits, causes errors in the pipeline. Such errors are herein referred to as clock signal races and are characterized by pipeline situations in which data in one stage "sneaks" through to a subsequent stage before the proper clocking signal is received. As known to those skilled in the art, lost clock edges as a result of signal skew may lead to such errors.

Those skilled in the art have overcome such clock signal race problems by using non-overlapping clock signals, which are typically differential clock signals in which one clock signal has a rising edge which occurs after a falling edge of the other clock signal and a falling edge which occurs before a rising edge of the other clock signal. Such signals prevent clock signal races in a pipelined circuit by deactivating a subsequent stage before data is allowed to propagate through the current stage. While such a clocking system prevents data from "sneaking" through to the next stage, it does so at significant performance cost due to the "dead" time between clock edges.

Global overlapping clocks generally provide timing advantages with respect to non-overlapping clocks in that there is no dead time between a falling edge of one clock signal and the rising edge of the other clock signal. As a result, early clock edges may be received which allow improved system performance of the pipelined circuits. Global overlapping clocks are also generally easier to distribute to the circuitry without closely controlling the clock skew caused by time/phase shifts. However, as just noted, if the clock skew is large, race conditions may be created which may cause information to be lost when only global overlapping clocks are used for clocking the pipelined circuits.

In order to prevent such race conditions and the resultant loss of data, quadrature clocking systems have been developed for use in pipelined circuits. Such quadrature clocking systems do not have the performance disadvantages of non-overlapping clocking systems and typically comprise two sets of overlapping clocks which are provided by two pairs of global clock drivers (or buffers). The extra set of overlapping clocks are offset with respect to the first set by approximately 90°. (they are shifted by 90° with respect to the first set of clock signals) such that a minimum amount of overlap time can be used to prevent races between respective stages of the pipelined circuits. However, enough overlap must be provided to allow a minimum time to set the latches of the pipelined circuits. The four clock edges of the quadrature clocking signals can then be applied to the respective stages of the pipelined circuits as appropriate to keep data moving without allowing data to "sneak" through a stage to the next stage before the appropriate clock edge is received.

Although a quadrature clocking system is generally quite effective at eliminating race conditions, such a clocking system requires that two extra clocking signals be routed to the respective chips and that extra buffer space be provided for the clocking signals. In addition, quadrature clocks comprised of overlapping clock signals are still susceptible to the skew problems of global overlapping clocks noted above without the benefits of early edges as when only a single pair of overlapping clock signals is used.

Accordingly, a clocking system is desired which has some of the performance advantages of global overlapping clock signals while being immune from the race problems which occur when only a single set of such overlapping clock signals are used. The present invention has been designed to meet this need.

SUMMARY OF THE INVENTION

The present invention relates to a clocking methodology for VLSI chips which uses global overlapping clocks plus locally or remotely generated non-overlapping clocks. Four clock edges are thus available in each block of the chip for use as timing edges. The global overlapping clocks are used when possible to provide timing advantages, while the non-overlapping clocks are used to eliminate race conditions as data propagates through the pipelined circuit in response to the clocking signals.

Such a clocking system in accordance with the invention preferably drives a pipeline of transparent data registers with two overlapping clocks CK1 and CK2 and two non-overlapping clocks CK1N and CK2N so as to prevent race conditions while maximizing performance. In particular, the clocking system of the invention, which provides clocking signals to respective stages of a pipelined circuit, preferably comprises means for generating first and second overlapping differential clock signals CK1 and CK2 and means for generating from CK1 and CK2 first and second non-overlapping differential clock signals CK1N and CK2N, CK1N having a rising edge which occurs after a falling edge of CK2N and a falling edge which occurs before a rising edge of CK2N. These clocking signals are then selectively provided to each stage of the pipelined circuit so as to prevent that stage from propagating data to a subsequent stage before the subsequent stage has been deactivated, thereby eliminating race conditions. However, the invention is further characterized in that at least one stage of the pipelined circuit receives CK1 or CK2 so as to decrease propagation time of data through the pipelined circuit and at least one stage of the pipelined circuit receives CK1N or CK2N. In other words, CK1N and CK2N are applied only when necessary to prevent race conditions while CK1 and CK2 are otherwise applied so as to gain performance advantage.

In accordance with a preferred embodiment of the invention, the means for generating CK1N and CK2N comprises first and second gates, the first gate having CK1 at a first input thereof and a fed back output of the second gate at a second input thereof, and the second gate having CK2 at a first input thereof and a fed back output of the first gate at a second input thereof, whereby the first gate outputs CK1N and the second gate outputs CK2N. Preferably, the first and second gates each comprise a series connection of a NAND gate and an inverter. The means for generating CK1N and CK2N also preferably includes a first feedback inverter between the inverter of the first gate and the second input of the NAND gate of the second gate and a second feedback inverter between the inverter of the second gate and the second input of the NAND gate of the first gate. The first and second feedback inverters of such an embodiment are preferably relatively slow relative to the inverters of the first and second gates so as to delay a rising edge of the fed back signal to the second inputs of the respective NAND gates with respect to a falling edge of CK1 and CK2 at the first inputs of the respective NAND gates.

In accordance with one embodiment of the invention, the stages comprise serially connected registers and the providing means comprises a switch at inputs to each of the registers which receive one of CK1, CK2, CK1N and CK2N which prevents that register from propagating data to a subsequent register before the subsequent register has been deactivated. In such an embodiment, at least the last stage receives either CK1 or CK2 so that the data may be output sooner.

On the other hand, in accordance with another embodiment of the invention, a combinational logic circuit may be provided between respective stages of the pipelined circuit. Such a combinational logic circuit in accordance with the invention has a propagation delay sufficiently great that a first stage immediately preceding it may be activated by either CK1 or CK2 before deactivation of a second stage immediately after it yet the second stage may be deactivated before data propagates through the first stage and the combinational logic circuit to the second stage. Such an embodiment thus starts the data propagating sooner by using CK1 or CK2 at the first stage yet prevents data from getting to the second stage before it is deactivated.

The teachings of the invention also include a method of providing clocking signals to respective stages of a pipelined circuit. Such a method in accordance with the invention comprises the steps of:

generating first and second overlapping differential clock signals CK1 and CK2;

generating from CK1 and CK2 first and second non-overlapping differential clock signals CK1N and CK2N, CK1N having a rising edge which occurs after a falling edge of CK2N and a falling edge which occurs before a rising edge of CK2N; and selectively providing to each stage of the pipelined circuit one of CK1, CK2, CK1N and CK2N which prevents that stage from propagating data to a subsequent stage before the subsequent stage has been deactivated, wherein at least one stage of the pipelined circuit receives either CK1 or CK2 so as to decrease propagation time of data through the pipelined circuit and at least one stage receives CK1N or CK2N so as to prevent clock signal race conditions.

Preferred embodiments of such a method include the steps of disposing a combinational logic circuit having a propagation delay between respective stages of the pipelined circuit, activating a first stage immediately preceding the combinational logic circuit with either CK1 or CK2 and then deactivating a second stage immediately after the combinational logic circuit such that the second stage is deactivated before data propagates through the first stage and the combinational logic circuit to the second stage. In accordance with the method of the invention, CK1N and CK2N may be generated either locally or remotely with respect to the pipelined circuit in response to globally generated CK1 and CK2.

BRIEF DESCRIPTION OF THE DRAWINGS

The above and other objects and advantages of the invention will become more apparent and more readily appreciated from the following detailed description of the presently preferred exemplary embodiments of the invention taken in conjunction with the accompanying drawings, of which:

FIG. 6 illustrates an additional embodiment of a register pipeline of the type shown in FIG. 2 wherein a significant amount of logic is disposed between two stages of the register pipeline.

FIGS. 7(a)–(d) illustrate timing diagrams indicating how data is clocked through the register pipeline of FIG. 6 in accordance with the invention.

DETAILED DESCRIPTION OF THE PRESENTLY PREFERRED EMBODIMENTS

The preferred embodiments of the invention will now be described with reference to FIGS. 1–7. It will be appreciated by those of ordinary skill in the art that the description given herein with respect to those figures is for exemplary purposes only and is not intended in any way to limit the scope of the invention. All questions regarding the scope of the invention may be resolved by referring to the appended claims.

As noted above, the present invention relates to a clocking methodology developed for VLSI chips which uses global overlapping clocks plus locally or remotely generated non-overlapping clocks. Four clock edges are thus available in each block of the chip for use as timing edges. Two overlapping clocks CK1 and CK2 are used for providing timing advantages of the type described in the background portion of the specification, and two non-overlapping clocks CK1N and CK2N are provided for eliminating race conditions as data propagates down a pipeline of registers responsive to the clock inputs. The global overlapping clocks are preferably designed to have a minimum amount of overlap or underlap such that clock skew is held to be less than 1 nsec for all inputs. The non-overlapping clocks are generated from the overlapping clocks either globally for application to all chips, locally at each chip, or locally at each block of the chip. Typically, the registers of the register pipeline are responsive to edges of the overlapping and non-overlapping clocks for propagating data downstream.

In a preferred embodiment of the invention, the non-overlapping clocks are locally generated at each block of the chip so that local clock skew may be better controlled. By locally generating the non-overlapping clocks in this manner, more control exists over the rise/fall times of the local clocks, and as a result, worst-case race conditions may be handled even for fast VLSI chips.

FIGS. 1(a)–(d) illustrate the timing relationships of the four clock signals CK1, CK2, CK1N and CK2N. As shown in FIGS. 1(a) and (b), CK1 and CK2 are differential overlapping clock signals; however, both can be high at the same time within an acceptable clock skew tolerance. CK1N and CK2N, on the other hand, are differential non-overlapping clock signals having a dead time between the time one clock falls and the other clock rises as shown in FIGS. 1(c) and (d). In addition, as shown, the edge of CK1 falls before CK2N rises, while CK2N is allowed to overlap the rising edge of CK1 but not the rising edge of CK1N. Also, by symmetry, the edge of CK2 falls before CK1N rises, while CK1N is allowed to overlap the rising edge of CK2 but not the rising edge of CK2N. Proper use of such clocking signals in accordance with the invention can eliminate race conditions while maximizing performance as will be described below.

Figure 2:
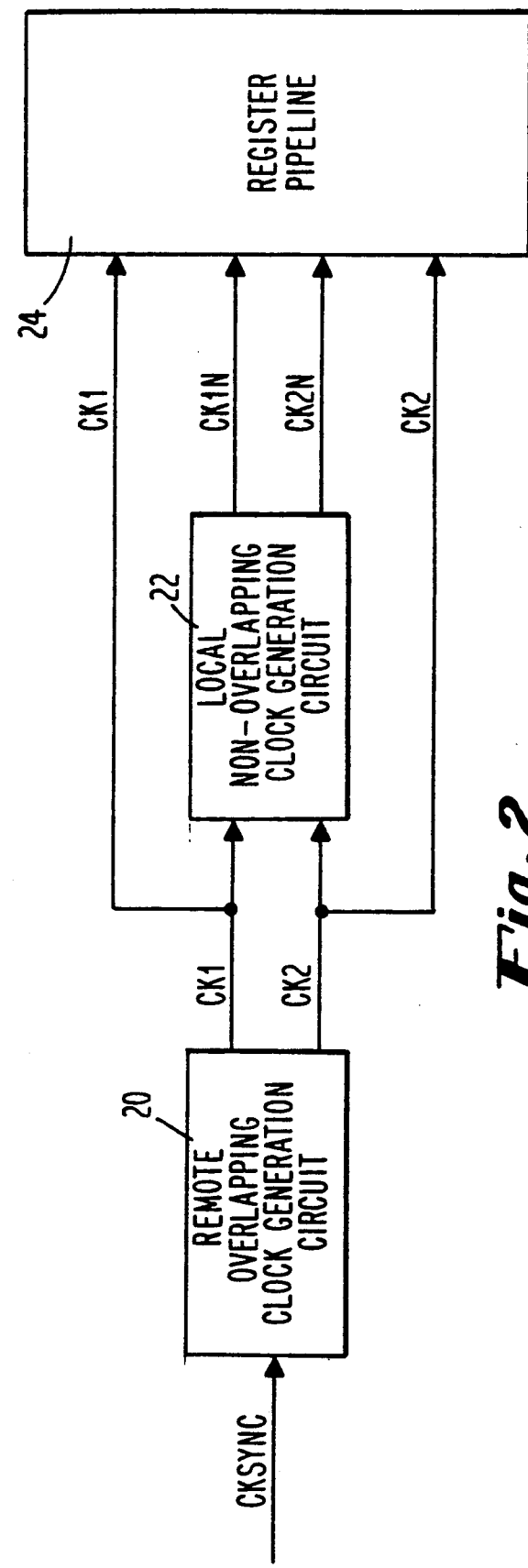
FIG. 2 illustrates a clock distribution system which provides overlapping and non-overlapping clock signals to a register pipeline in accordance with the invention.

FIG. 2 illustrates a clock distribution system in accordance with the invention. As shown, global overlapping clock generation circuit 20 generates from a synchronizing signal CKSYNC overlapping clock signals CK1 and CK2. Overlapping clock generation circuit 20 generally comprises global clock drivers which buffer the clock inputs and provide low delay, high capacitance drive outputs in accordance with known techniques. Preferably, the global overlapping clock generation circuit 20 and its clock distribution network are designed in such a manner that the distribution delays and skews are minimized. Outputs CK1 and CK2 of the overlapping clock generation circuit 20 are then input into a non-overlapping clock generation circuit 22 which may be external to the chip, but which in a preferred embodiment, is on the chip. As will be described below with reference to FIG. 3, non-overlapping clock generation circuit 22 contains non-overlapping clock generators which introduce a dead time between the falling edge of CK1N and the rising edge of CK2N and a dead time between the falling edge of CK2N and the rising edge of CK1N. The four clock signals CK1, CK2, CK1N and CK2N are then input into a register pipeline 24 for controlling propagation of data therethrough as will be described below with reference to FIGS. 4–7.

Figure 1:
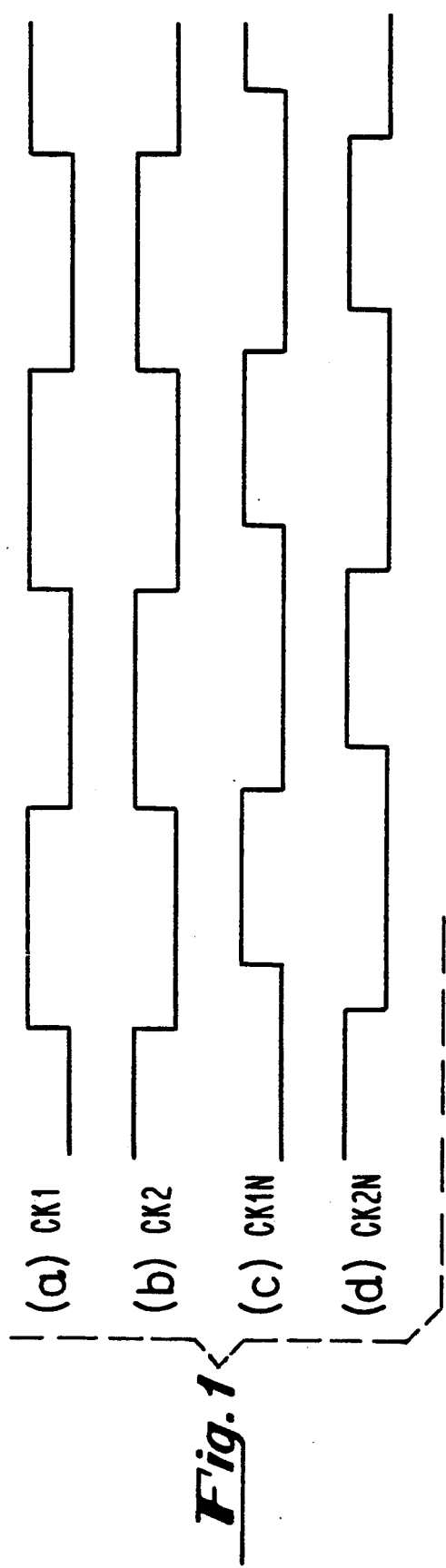
FIGS. 1(a)–(d) illustrate the timing relationships of two overlapping clock signals (FIGS. 1(a) and (b)) and two non-overlapping clock signals (FIGS. 1(c) and (d)).
Figure 3:
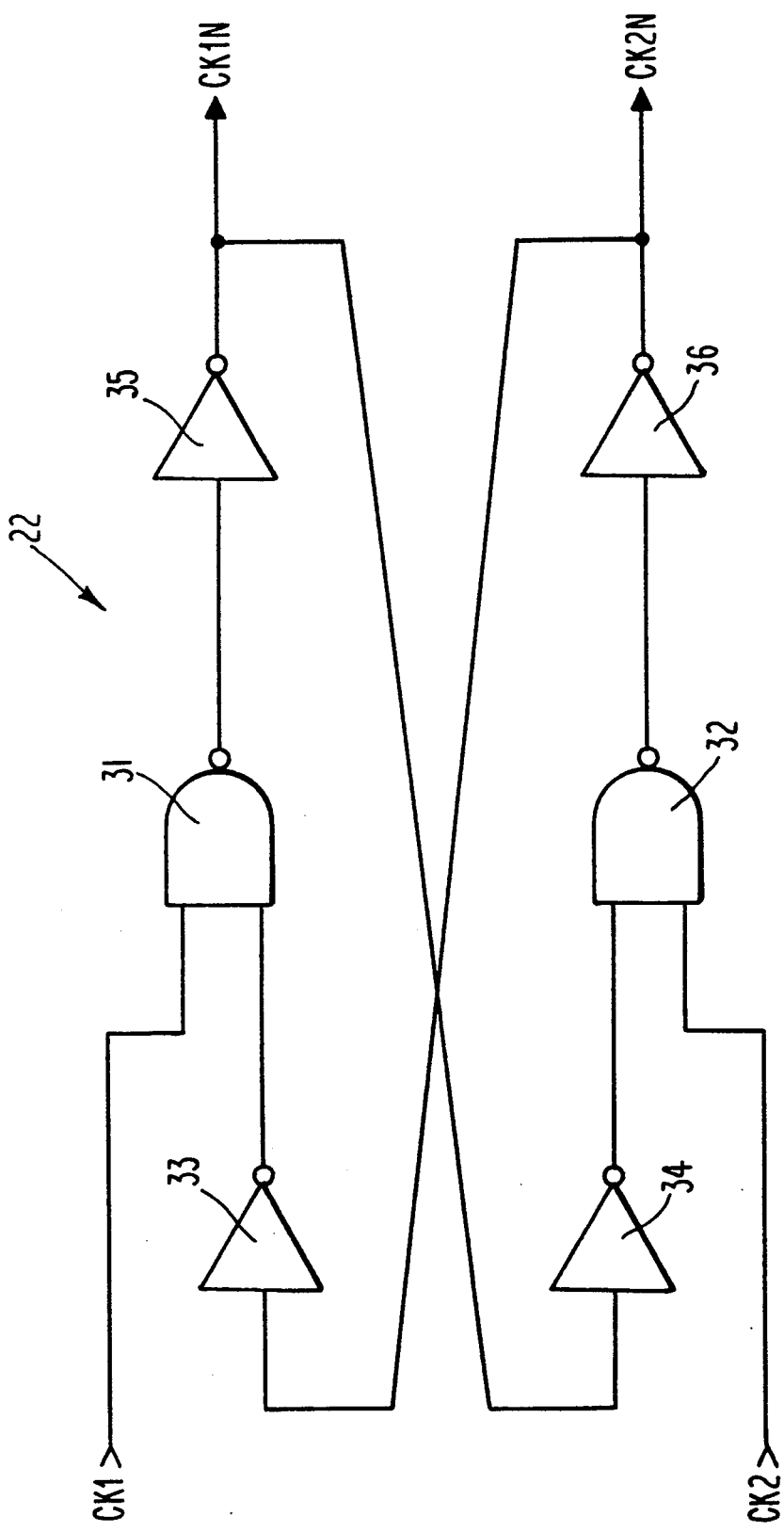
FIG. 3 illustrates a block diagram of a non-overlapping clock generation circuit of the type shown in FIG. 2.

FIG. 3 illustrates a preferred embodiment of a non-overlapping clock generation circuit 22 in accordance with the invention. As shown in FIG. 1, the falling edge of CK1 causes the CK1N output to go low, while only after CK2 goes high and CK1N goes low is CK2N allowed to go high. As a result, the non-overlapping clock generation circuit 22 of the invention is designed to be symmetric so that CK1N is generated in the same manner as CK2N. In particular, the clock inputs CK1 and CK2 are input into respective NAND gates 31 and 32, while the other inputs of the NAND gates 31 and 32 receive the outputs of inverter circuits 33 and 34, which, in turn, receive the respective feedback outputs from inverters 35 and 36. Preferably, NAND gates 31 and 32 and inverters 35 and 36 are made fast in order to minimize the delay from the falling edge of CK1 to the falling edge of CK1N. However, inverters 33 and 34 are preferably relatively slow to ensure enough dead time between the clock signal edges of CK1N and CK2N even under fast process conditions.

As noted above, the non-overlapping clock generation circuit 22 of the invention may generate global or local non-overlapping clock signals CK1N and CK2N. However, if the non-overlapping clocks are generated globally, two more clock signal paths must be routed on each chip of the register pipeline and more clock skew between phases is introduced into the timing system because of the clock routing. Thus, the non-overlapping clock generation circuit 22 of the invention is preferably disposed on each chip for local rather than global clock signal generation. This makes it easier to control the skew between phases of the non-overlapping clock. By disposing the non-overlapping clock generation circuits 22 in each block, the amount of capacitive loading on the global clock network is correspondingly reduced. The reduced capacitance thus allows faster edges and smaller skews on the global overlapping clocks, which further improves the performance of critical timing paths which use the global overlapping clocks. Hence, the presently preferred embodiment of the invention uses non-overlapping clock generation circuits 22 which generate local non-overlapping clock signals at each block of the chip.

Figure 4:
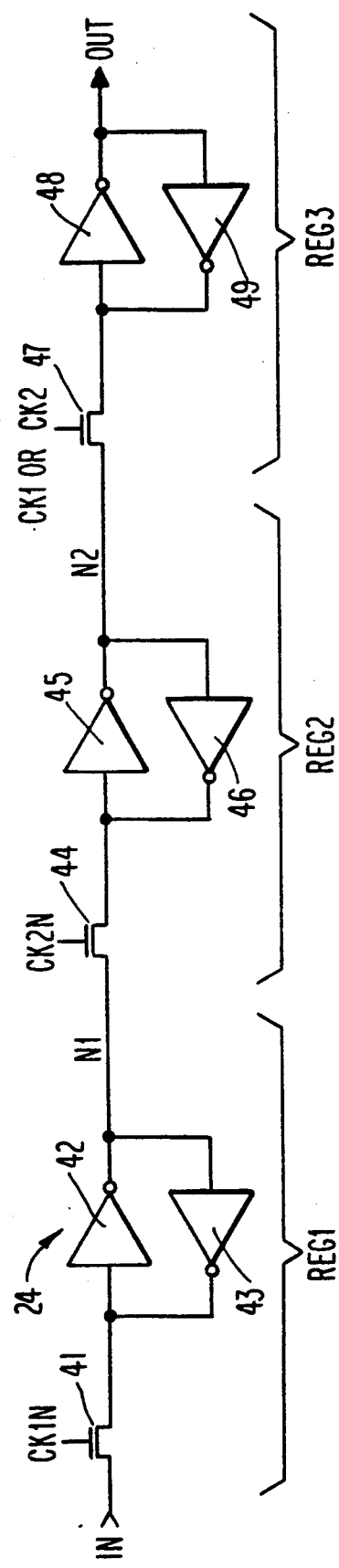
FIG. 4 illustrates a simple embodiment of a register pipeline of the type shown in FIG. 2.

FIG. 4 illustrates a simple embodiment of a register pipeline 24 which is responsive to the overlapping and non-overlapping clock signals of the invention. Generally, the register pipeline 24 of FIG. 4 comprises a series of transparent registers such as registers REG1, REG2 and REG3 which are used to propagate data through the register pipeline in response to respective edges of the clocking signals. As shown in FIG. 4, when an input signal IN is received, it is clocked through an FET switch 41 into a first register REG1 having inverters 42 and 43 in response to non-overlapping clock signal CK1N. The output of REG1 at node N1 is then clocked through FET 44 by non-overlapping clock signal CK2N into REG2 having inverters 45 and 46. Then, the output at node N2 of REG2 is clocked through FET 47 into REG3 having inverters 48 and 49 by overlapping clock signal CK1 or CK2. In the embodiment shown, the output of REG3 is then provided to the output OUT. As will be described below, the data propagation through the register pipeline 24 of FIG. 4 is performed without race conditions and with increased performance by proper selection of the respective clocking signals. For example, in the embodiment of FIG. 4, OUT is received sooner than in prior art systems since the last register, REG3, outputs the data in response to CK1 rather than waiting for the appropriate edge of CK1N. This improvement becomes substantial for some systems, such as those with many short pipelines.

Figure 5:
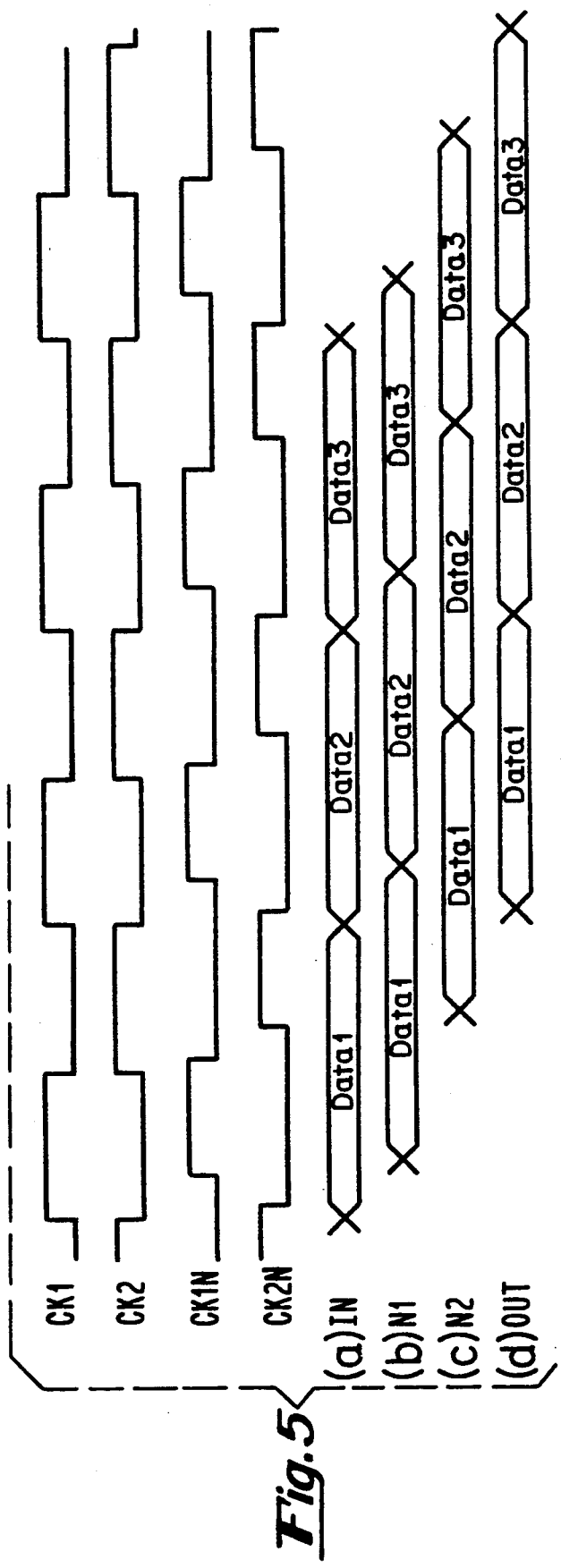
FIGS. 5(a)–(d) illustrate timing diagrams indicating how data is clocked through the register pipeline of FIG. 4 in accordance with the invention.

Clock edges of clock signals CK1 and CK2 are used in the register pipeline when possible to start the data propagating sooner, while CK1N and CK2N are used in the register pipeline as necessary to prevent clock signal races. However, there are several bounds to such placement of clock edges CK1, CK2, CK1N and CK2N in the register pipeline 24. For example, the speed of the logic places a lower bound on the duration of the clock period. As shown in FIGS. 4 and 5, the data starts to propagate through the first stage (REG1) on the rising edge of CK1 as shown in FIG. 5(a) and must be valid at the input of the subsequent stage (REG2) before CK2N goes low. Non-overlapping clocks, as noted above, introduce a dead time between the time when one clock edge goes low and the next edge is allowed to go high. This dead time delays the rising edge of CK1N and thus steals from the time available in the clock period for "useful" work. On the other hand, the amount of dead time between non-overlapping clock edges must be large enough to prevent race conditions between adjacent registers. The amount of dead time must be large enough to compensate for skews in generating and distributing the non-overlapping clocks. These skews are due largely to differences in the RC delays in the distribution network and to differences in the loading of the two phases. With larger die sizes and higher operating frequencies, the amount of dead time required to generate non-overlapping clock edges becomes a significant percentage of the clock period. Of course, this is undesirable. For fast processes, the dead time must be large enough to ensure non-overlapping clock edges, while the dead time for slow processes will unfortunately be even larger. This dead time is wasted in clock methodologies which employ only non-overlapping clocks.

Accordingly, the clocking methodology in accordance with the invention uses the non-overlapping clocks in the stages where race conditions are a problem, and overlapping clocks are used in situations where possible to provide a performance advantage. Thus, in accordance with the techniques of the invention, the dead time between non-overlapping clock edges is not wasted for those situations in which overlapping clock signals may be used without introducing errors caused by race conditions.

As noted above, race conditions occur when the clock input to a register such as REG1 is allowed to rise before the clock input to REG2 falls (FIG. 4). This may occur when overlapping clocks are used, for if the propagation delay through REG1 is less than the amount of clock overlap, the data which is being latched into REG1 can "sneak" into REG2 and subsequent stages as well without being stopped by the proper clock edge. This race condition is avoided by the use of non-overlapping clocks CK1N and CK2N in accordance with the invention. The use of such non-overlapping clocks guarantees that the clock input to REG2 is low before the clock input to REG1 is allowed to rise, thereby preventing a sneak path from existing. For example, as shown in FIG. 4, the output of REG1 at node N1 is valid at the falling edge of CK1N (FIG. 5(b)), but REG2 must wait until CK2N rises before propagating the data to node N2 (FIG. 5(C)). As a result, no race conditions may occur and no data may sneak from REG1 to REG2. However, there are situations in which an overlapping clock can safely be used to improve the system performance such that the dead time may be eliminated while still providing immunity to the master-slave race condition.

An example of where an overlapping clock signal may be used in the register pipeline 24 so as to improve performance is shown in the final register stage of FIG. 4. As shown, REG3 uses the global overlapping clock CK1 or CK2 rather than the non-overlapping clock CK1N while still avoiding a race condition between REG2 and REG3 since CK1 is guaranteed to fall and CK2 is guaranteed to rise before CK2N is allowed to rise by the non-overlapping clock generation circuit 22. This may be seen in FIG. 5(d). The advantage of using the overlapping clock CK1 in REG3 is that CK1 or CK2 occurs earlier than CK1N. As a result, the dead time between CK2N falling and CK1N rising is not wasted. The use of CK1 or CK2 further allows OUT to become valid earlier than if CK1N was used, thereby providing an important performance advantage.

FIG. 5(a)–(d) illustrate the propagation of data through the register pipeline 24 of FIG. 4 in accordance with the techniques just described. As shown, input data IN (FIG. (a)) is input into REG1 when CK1 goes high. When CK1N goes high, data is propagated to node N1 as shown in FIG. 5(b). Data is then propagated from node N1 of REG1 to REG2 on the rising edge of CK2N as shown in FIG. 5(c). The output at node N2 of REG2 is then propagated to REG3 upon the receipt of the next rising edge of CK1 or falling edge of CK2. As just noted, the rising edge of CK1 occurs prior to the rising edge of CK1N in accordance with the invention, and accordingly, the dead time between the falling edge of CK2N and the rising edge of CK1N is avoided. The speed of data throughput is thus enhanced.

Another example of where the overlapping clock may be preferably used in place of a later occurring non-overlapping clock is when there is a significant amount of combinational logic 60 between respective stages REG1 and REG2 of the register pipeline 24 as shown in FIG. 6. In this embodiment, CK1 may rise at REG1 before CK2N at REG2 falls because of the propagation delay of the combinational logic circuit 60. More particularly, the race condition is avoided so long as the propagation delay through the register REG1 plus the propagation delay through combinational logic 60 is greater than the amount of overlap between CK1 and CK2N. By using the overlapping clock CK1 instead of the non-overlapping clock CK1N in this situation, evaluation of the logic starts earlier, and in turn, completes earlier, so that higher clock frequencies may be used.

The above may be seen more clearly by referring to FIG. 7. As shown in FIG. 7(a), the input data IN is received by REG1 when CK1 goes high and is received at the output node N1 of REG1 a short time thereafter as shown in FIG. 7(b). The data then propagates through combinational logic 60 and arrives at node N2 at a later time as shown in FIG. 7(c). Then, when a rising edge of CK2N is received by REG2, the data is propagated to OUT as shown in FIG. 7(d). As shown, the data propagates through combinational logic 60 to node N2 before CK2N goes high, thereby avoiding a race condition. Thus, by using clock signal CK1 in REG1, the data may start propagating sooner rather than waiting for the rising edge of CK1N. Processing speed may thus be increased by using the combined overlapping and non-overlapping clocking arrangement in accordance with this embodiment.

In sum, for the case of a register pipeline consisting of at least three registers, A, B and C in sequence, the following clocking constraints must be met in accordance with the invention to guarantee race free operation:

(1) The clock received by register B must fall before the data propagated through register A reaches register B.

(2) The clock received by register C must fall before the data propagated through register B reaches register C.

In other words, the clocking signals used in middle registers of the chain must satisfy two constraints, namely, they must fall before the data passed by a previous stage arrives and they must not allow data to pass which will reach the next stage before the clock of the next stage falls. Non-overlapping clocks are generally used to satisfy these constraints, but in appropriate circumstances, as in the embodiments described herein with reference to FIGS. 4 and 6, CK1 or CK2 may be used so as to increase performance.

However, the clocking signals used for the first and last registers of the register pipeline 24 have only a one-sided constraint, namely, that the clock edge must fall before a previous stage allows data to propagate to an input thereof (in the case of the last register), or the clock edge must rise late enough to prevent data from propagating to a subsequent stage before the clock edge of the next stage falls (in the case of the first register). The overlapping clock signals meet this constraint and thus can be used to start data propagating into the first register or the last register of the register pipeline 24 without waiting for the next non-overlapping clock edge. By contrast, the non-overlapping clock does not go high until the overlapping clock of the same phase has gone high and the overlapping clock of the opposite phase has gone low and thus does not change state as soon as the overlapping clock. The design of the present invention thus allows the system to use the earliest edge received whether it be a non-overlapping clock edge or an overlapping edge, so long as race conditions may be prevented.

Thus, as just noted, when a register is the last storage element of a queue, such as a pad driver or a translation look-aside buffer (TLB) RAM, an overlapping clock can be used to qualify the register set without waiting for the next non-overlapping clock edge. Moreover, overlapping clocks may be used in circuits that require precharging, such as PLAs and TLB RAMs, since such circuits are race-free if properly designed. Overlapping clocks may also be used at the beginning and end of the register pipeline under proper circumstances of the type just noted. Generally, other registers of the register pipeline 24 are responsive to non-overlapping clocks to prevent race conditions, although overlapping clocks may be used throughout the register pipeline 24 so long as the above conditions are met.

The clocking methodology described herein thus provides both global overlapping clocks and locally (or remotely) generated non-overlapping clocks, the appropriate clock edge being available to the pipeline designer depending upon the circumstances. Either a non-overlapping clock is used to prevent race conditions between adjacent registers, or an overlapping clock edge is used in cases where the performance would be limited by the use of a non-overlapping edge. This is beneficial, for as VLSI chips grow in size and clock frequencies increase, the amount of dead time required between non-overlapping clock edges becomes a significant percentage of the clock period. By using overlapping clock edges in critical timing paths in accordance with the teachings of this application, the dead time may be eliminated, and higher operating frequencies will become possible. Moreover, as described above, by using non-overlapping clocks which are locally generated in each block rather than globally, it becomes easier to control the skew between phases of the non-overlapping clock. The use of local non-overlapping clock generators in each block also reduces the amount of capacitive loading on the global clock network, thereby allowing faster edges and smaller skews on the global overlapping clock so as to further improve the performance of critical timing paths which use the global overlapping clock.

Those skilled in the art will readily appreciate that many modifications to the invention are possible within the scope of the invention. For example, the non-overlapping clock generation circuit 22 may be placed locally at a block of a chip, locally on the chip or on a particular PC board, or the non-overlapping clock generation circuit 22 may be located with the global overlapping clock generation circuit 20 at a point remote from the chip. In such a case, CK1, CK2, CK1N and CK2N would all be provided to the VLSI circuits of the system as global clocking signals. Of course, the clocking system of the invention may also be used with a much more complicated register pipeline 24 than that described herein. Accordingly, the scope of the invention is not intended to be limited by the preferred embodiments described above, but only by the appended claims.

We claim:

1. A clocking system for providing clocking signals to respective stages of a pipelined circuit, comprising:
    means for generating first and second overlapping differential clock signals CK1 and CK2;
    means for generating from CK1 and CK2 first and second non-overlapping differential clock signals CK1N and CK2N, CK1N having a rising edge which occurs after a falling edge of CK2N and a falling edge which occurs before a rising edge of CK2N; and
    means for selectively providing to each stage of said pipelined circuit one of CK1, CK2, CK1N and CK2N which prevents that stage from propagating data to a subsequent stage before the subsequent stage has been deactivated, wherein at least one stage of said pipelined circuit receives one of CK1 and CK2 and at least one stage of said pipelined circuit receives one of CK1N and CK2N.

2. A clocking system as in claim 1, wherein said means for generating CK1N and CK2N comprises first and second gates, said first gate having CK1 at a first input thereof and a fed back output of said second gate at a second input thereof, and said second gate having CK2 at a first input thereof and a fed back output of said first gate at a second input thereof, said first gate outputting CK1N and said second gate outputting CK2N.

3. A clocking system as in claim 2, wherein said first and second gates each comprise a series connection of a NAND gate and an inverter.

4. A clocking system as in claim 3, wherein said means for generating CK1N and CK2N further comprises a first feedback inverter between said inverter of said first gate and the second input of said NAND gate of said second gate and a second feedback inverter between said inverter of said second gate and the second input of said NAND gate of said first gate, said first and second feedback inverters propagating data at a rate relatively slower than said inverters of said first and second gates so as to delay a rising edge of a fed back signal to said second inputs of said respective NAND gates with respect to a falling edge of CK1 and CK2 at said first inputs of said respective NAND gates.

5. A clocking system as in claim 1, wherein said stages comprise serially connected registers and said providing means comprises a switch at inputs to each of said registers, said switches at each register receiving one of CK1, CK2, CK1N and CK2N which prevents that register from propagating data to a subsequent register before the subsequent register has been deactivated.

6. A clocking system as in claim 1, wherein one of CK1 and CK2 is provided to a last stage of said pipelined circuit.

7. A clocking system as in claim 1, further comprising a combinational logic circuit between respective stages of said pipelined circuit, said combinational logic circuit having a propagation delay sufficiently great so that a first stage immediately preceding said combinational logic circuit may be activated by one of CK1 and CK2 before deactivation of a second stage immediately after said combinational logic circuit and so that said second stage may be deactivated before data propagates through said first stage and said combinational logic circuit to said second stage.

8. A clocking system as in claim 1, wherein said means for generating CK1N and CK2N is disposed local to said pipelined circuit and said means for generating CK1 and CK2 is remote from said pipelined circuit.

9. A method of providing clocking signals to respective stages of a pipelined circuit, comprising the steps of:

generating first and second overlapping differential clock signals CK1 and CK2;

generating from CK1 and CK2 first ad second non-overlapping differential clock signals CK1N and CK2N, CK1N having a rising edge which occurs after a falling edge of CK2N and a falling edge which occurs before a rising edge of CK2N; and selectively providing to each stage of said pipelined circuit one of CK1, CK2, CK1N and CK2N which prevents that stage from propagating data to a subsequent stage before the subsequent stage has been deactivated, wherein at least one stage of said pipelined circuit receives one of CK1 and CK2 and at least one stage of said pipelined circuit receives one of CK1N and CK2N.

10. A method as in claim 9, wherein said providing step includes the step of applying one of CK1 and CK2 to a last stage of said pipelined circuit.

11. A method as in claim 9, comprising the further steps of disposing a combinational logic circuit between respective stages of said pipelined circuit, activating a first stage immediately preceding said combinational logic circuit by one of CK1 and CK2 and then deactivating a second stage immediately after said combinational logic circuit, whereby said second stage is deactivated before data propagates through said first stage and said combinational logic circuit to said second stage.

12. A method as in claim 9, wherein CK1N and CK2N are generated locally with respect to said pipelined circuit and CK1 and CK2 are generated remotely from said pipelined circuit.

* * * * *